US006977212B2

(12) United States Patent
Ammlung et al.

(10) Patent No.: US 6,977,212 B2
(45) Date of Patent: Dec. 20, 2005

(54) FABRICATING A SEMICONDUCTOR DEVICE USING FULLY CURED BISBENZOCYCLOBUTENE

(75) Inventors: Richard Lee Ammlung, Sykesville, MD (US); David Jerome Mountain, Baltimore, MD (US)

(73) Assignee: The United States of America as represented by the National Security Agency, Washington, DC (US)

( * ) Notice: Subject to any disclaimer, the term of this patent is extended or adjusted under 35 U.S.C. 154(b) by 73 days.

(21) Appl. No.: 10/470,621

(22) Filed: Jan. 8, 2004

(65) Prior Publication Data

US 2005/0153477 A1   Jul. 14, 2005

(51) Int. Cl.[7] ............................................. H01L 21/44
(52) U.S. Cl. ................... 438/612; 430/287.1
(58) Field of Search ....... 257/12, 79, 94; 438/612–616

(56) References Cited

U.S. PATENT DOCUMENTS

| 5,872,572 A | 2/1999 | Rossignac |
| 6,204,081 B1 | 3/2001 | Kim et al. |
| 6,284,149 B1 | 9/2001 | Li et al. |
| 6,361,926 B1 * | 3/2002 | So et al. .................. 430/287.1 |
| 6,514,872 B1 | 2/2003 | Oikawa |
| 6,763,156 B2 * | 7/2004 | Palmer et al. ................. 385/14 |
| 2002/0105003 A1 * | 8/2002 | Yang et al. .................... 257/94 |
| 2003/0134496 A1 * | 7/2003 | Lee et al. .................... 438/612 |

* cited by examiner

Primary Examiner—Michael Lebentritt
Assistant Examiner—Andre' C. Stevenson
(74) Attorney, Agent, or Firm—Jennifer P. Ferragut

(57) ABSTRACT

The present invention is a method of fabricating a semiconductor device using a fully cured BCB layer and removing the same using wet etching. The first step is selecting a substrate. The second step of the method is producing an oxide layer or other coating on the substrate. The third step is applying a BCB layer on the oxide layer. The fourth step is fully curing the BCB layer. The fifth step is processing the device. The sixth step is stressing the substrate, preferably causing the substrate to warp. The seventh step is wet etching the BCB layer. The eighth step is removing the BCB layer. The ninth step is removing the oxide layer.

7 Claims, 1 Drawing Sheet

FABRICATING A SEMICONDUCTOR DEVICE USING FULLY CURED BISBENZOCYCLOBUTENE

FIELD OF THE INVENTION

This invention relates to a semiconductor device manufacturing process and, more specifically, to a semiconductor device manufacturing process involving wet chemical etching.

BACKGROUND OF THE INVENTION

Bisbenzocyclobutene (BCB) was developed for use as a dielectric in semiconductor devices, specifically multi-chip module (MCM) applications. BCB is especially well suited for these applications because it adheres well to semiconductor materials such as silicon, silicon oxide, silicon nitride, aluminum, copper and polyimide. It is also used because it has a service temperature in excess of 300 degrees Celsius. These properties make BCB additionally desirable as a masking material, a protection layer and a wafer bonding material.

Despite the advantages of BCB, industry has avoided using BCB in many situations due to a significant practical problem related to BCB processing. The primary problem with the material is that it is resistant to wet chemical etching, particularly when the BCB has been fully cured. Because the BCB resists wet chemical etching, processing of BCB must be done by dry etching or plasma treatments. As is known by those skilled in the art, both of these processes commonly result in significant damage to the device leading to increased waste and excessive cost to the manufacturer. Consequently, many manufacturers have refused to incorporate BCB into semiconductor devices or have increased the cost of devices requiring the use of BCB to account for their own increased costs.

U.S. Pat. No. 5,879,572 entitled "METHOD OF PROTECTING SILICON WAFERS DURING WET CHEMICAL ETCHING," discloses a process for micromachining silicon wafers using BCB as an etch mask. In this process, a film of partially cured BCB is applied over the metallization and circuitry on the wafer. The BCB protects these objects during wet chemical etching of the substrate. After etching of the substrate, the BCB is completely removed by dry etching or, because the BCB is only partially cured, a limited number of wet etch techniques. The present invention does not involve the application of a partially cured BCB protective layer. U.S. Pat. No. 5,879,572 is hereby incorporated by reference into the specification of the present invention.

U.S. Pat. No. 6,204,081 entitled "METHOD OF MANUFACTURING A SUBSTRATE OF A LIQUID CRSTAL DISPLAY DEVICE," discloses a process for etching a substrate using a light developable BCB protection layer. A mask is placed over the BCB layer, exposing only certain portions of the layer to a light source. The light source removes the exposed portions of the light developable BCB layer. The present invention does not use a light source to remove a BCB layer. U.S. Pat. No. 6,204,081 is hereby incorporated by reference into the specification of the present invention.

U.S. Pat. No. 6,284,149 entitled "HIGH-DENSITY PLASMA ETCHING OF CARBON-BASED LOW-K MATERIALS IN AN INTEGRATED CIRCUIT," discloses a plasma etching process for a BCB dielectric layer. A hard mask is placed over an upper BCB layer, the BCB layer being etched by a gas of oxygen, a fluorocarbon and nitrogen. The present invention does not use a gas to etch BCB. U.S. Pat. No. 6,284,149 is hereby incorporated by reference into the specification of the present invention.

U.S. Pat. No. 6,514,872 entitled "METHOD OF MANUFACTURING A SEMICONDUCTOR DEVICE," discloses a semiconductor having a BCB film applied over an insulating layer. The BCB film is fully cured and dry etched in an inductive coupled plasma reactive furnace. The present invention does not involve dry etching of a fully cured BCB layer. U.S. Pat. No. 6,514,872 is hereby incorporated by reference into the specification of the present invention.

As can be seen from the prior art, the difficulty with the use of BCB is that once it is fully cured wet etching techniques are ineffective. Because applications requiring precision processing often necessitate wet etching of the dielectric layer, and do not allow the substitution of partially cured BCB that may allow some degree of wet etching, BCB has been abandoned for many devices where it would otherwise be the ideal material. An example of such an application is the use of BCB as a wafer bonding material. It is therefore desirable in the art to have a method for effectively processing fully cured BCB with a wet etch process.

SUMMARY OF THE INVENTION

It is an object of the present invention to fabricate a semiconductor device by wet etching a fully cured BCB layer.

It is a further object of the present invention to fabricate a semiconductor device by wet etching and subsequently removing a fully cured BCB layer.

It is another object of the present invention to fabricate a semiconductor device by wet etching and subsequent removing a fully cured BCB layer without damage to the device surface.

The present invention is a method of wet etching a semiconductor device having at least one BCB layer. The first step of the method is selecting a substrate. The substrate is preferably a silicon wafer.

The second step of the method is coating the front surface of the substrate with an oxide layer.

The third step of the method is applying a BCB layer on top of the oxide layer. The BCB layer is preferably applied by spin coating.

The fourth step of the method is baking the device until the BCB layer is fully cured.

The fifth step of the method is processing the device. Processing may, for example, involve grinding, etching, polishing or performing other techniques on the back side of the substrate, depositing layers or defining patterns on the front side of the substrate.

The sixth step of the method is to stress the substrate, preferably causing the substrate to warp. The stress is preferably created by mechanically grinding the substrate such that the substrate becomes thinner.

The seventh step of the method is breaking the bonds within the BCB layer and between the BCB layer and the oxide layer. This is a process commonly referred to as wet etching. The wet etch is preferably performed using a chemical mixture of hydrofluoric acid, nitric acid, phosphoric acid and sulfuric acid.

The eighth step of the method is removing the BCB layer, preferably using a standard dump rinse tank.

The ninth step of the method is removing the oxide layer, preferably using an acid etch.

DETAILED DESCRIPTION OF THE PREFERRED EMBODIMENT

Figure 1:
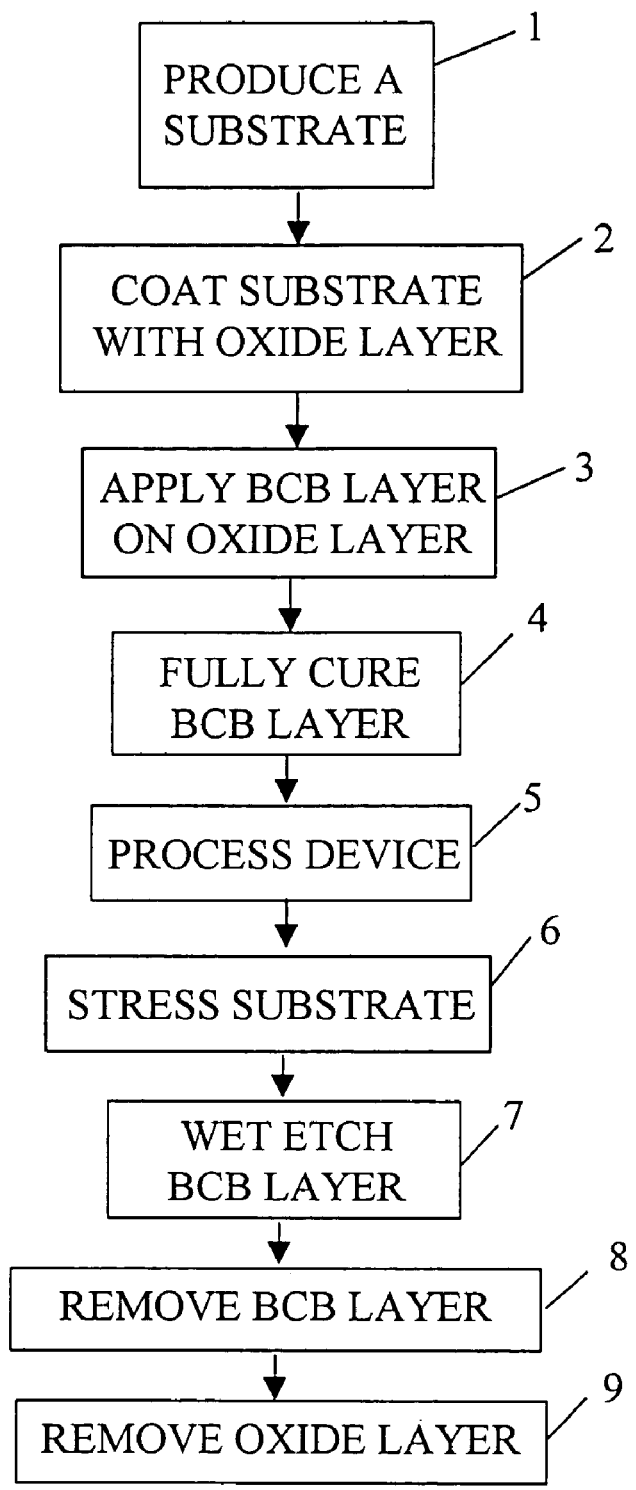
FIG. 1 is a flowchart of the semiconductor processing steps of the present invention.

The present invention is a method of fabricating a semiconductor device having a wet etched fully cured BCB layer. FIG. 1 is a list of the steps of the present invention.

The first step 1 of the method, shown in FIG. 1, is selecting a substrate. The substrate is composed of suitable material, many of which are well known and commonly used in the art, but is preferably a silicon wafer. In a preferred embodiment the substrate has a diameter of approximately 150 mm.

The second step 2 of the method is depositing an oxide layer onto the substrate. The oxide layer can be formed from any suitable oxide, as would be obvious to one of skill in the art, but is preferably formed from silicon oxide. In a preferred embodiment the oxide layer is approximately 6000 Angstroms thick. In place of the oxide, any other suitable layer may also be deposited on the substrate. Examples of such layers would include polyimide or chrome. In an alternative embodiment, the second step 2 is omitted, and no oxide layer is applied to the substrate.

The third step 3 of the method is applying a BCB layer on top of the oxide layer. If the second step 2 is omitted, the BCB layer is applied directly on top of the substrate. The BCB layer can be composed of any benzocyclobutene-based material, such as benzocyclobutene, bisbenzocyclobutene, or divinyl siloxane-benzocyclobutene. The BCB layer can be applied by any suitable means, but is preferably applied by spin coating.

The fourth step 4 of the method is baking the substrate, oxide layer (if used), and BCB layer until the BCB layer is fully cured. In the preferred embodiment the device is first placed on a hot plate until the BCB layer is partially cured, and is subsequently placed in an oven until the BCB layer is fully cured. To bake the device until the BCB layer is partially cured, the device is preferably placed in a heating apparatus at a low temperature for a sufficient period of time to evaporate any solvents. The BCB layer may be partially cured using any suitable means, but is preferably cured using a hot plate set to approximately 80 degrees Celsius. To bake the device until the BCB layer is fully cured, the device is placed in a heating apparatus at a high temperature until the BCB layer is completely cured and polymerized. Any suitable means may be used to hard bake the device, many of which are well known and commonly used in the art. In a preferred embodiment the BCB layer is fully cured in an oven heated to approximately 250 degrees Celsius or greater. In a further preferred embodiment the device placed in this oven for at least one hour.

In an optional step (not shown), processing may be performed on the device during the partially cured state. An example of processing commonly performed at this time is exposure of the device to light through a lithographic mask in photolithographic applications. Another example of processing is to bond the device to a second substrate, such as a silicon wafer, also coated with partially cured BCB. Many other appropriate processing steps would be obvious to those skilled in the art, and any such suitable process could be performed according to user preferences.

The fifth step 5 of the method is processing the device. Several methods are commonly used to process semiconductor devices, and any such suitable method can be used in conjunction with this invention. For example, the back side of the substrate can be processed by a suitable method such as grinding or vapor deposition. In this case, the BCB layer would serve as a protective layer for the front side of the substrate, along with any instruments located thereon. Alternatively, if the BCB layer has been lithographically defined it can operate as a hard mask to define patterns in the substrate. Because the BCB layer is resistant to many wet and dry chemical etching processes, and can be used at temperatures in excess of 300 degrees Celsius, there are a variety of other suitable processes that could be performed at this stage, as would be obvious to one of skill in the art. Any such process could be performed according to user needs and specifications.

The sixth step 6 of the process is stressing the substrate. In a preferred embodiment, stress is introduced in the substrate by mechanically grinding the substrate. The grinding inherently creates stress in the wafer, as will be obvious to one of skill in the art. Alternatively, a material film can be deposited on the front or back side of the substrate, the material film being cured to create stress on the substrate. Any suitable material can be used to create the film, examples of suitable materials being silicon nitride and electroplated copper. Another method of creating stress is the application of additional layers of BCB to the front or back side of the substrate, these BCB layers being cured to create stress on the substrate in a manner that would be obvious to one of skill in the art. Additional methods of creating stress on the substrate are possible, many of which are well known in the art and any of which may be used in conjunction with this invention. In a preferred embodiment, as stress is placed on the substrate the substrate warps slightly. The warping assists in removal of the BCB layer from the substrate. As would be obvious to one of skill in the art, many of the processes which one might perform in the fifth step 5 of the method are also capable of stressing the substrate.

The seventh step 7 of the method is wet etching the BCB layer. The wet etch can be performed using any suitable chemical solvents, but is preferably performed using a mixture of hydrogen fluoride, nitric acid, sulfuric acid and phosphoric acid. During the wet etch process the chemical solvents penetrate into the BCB layer and attack the bonds within the BCB layer and at the BCB layer—oxide layer interface, and the oxide layer helps protect the substrate from attack by the chemical solvents. If no oxide layer is used, the wet chemical solvents used during the wet etch process penetrate into the BCB layer and attack the bonds within the BCB layer and at the BCB layer—substrate interface. The wet etch is performed until the desired amount of the BCB layer is exposed, which in a preferred embodiment is the entire BCB layer. After this wet etch process the BCB layer remains completely intact, but is only held to the substrate by weak surface attraction.

The eighth step 8 of the method is removing the BCB layer from the substrate. Any suitable method can be used to remove the BCB layer from the device, many of which are well known and commonly used in the art. In a preferred embodiment the BCB layer is removed from the substrate using a standard dump rinse tank, which easily separates the BCB layer from the oxide layer. If no oxide layer is used, the BCB layer is separated directly from the substrate, this being the final step of the method.

Assuming an oxide layer is used, the ninth step 9 of the method is removing the oxide layer from the substrate. As with the BCB layer, any suitable method can be used to remove the oxide layer from the substrate, many of which would be obvious to one of skill in the art. In a preferred embodiment the oxide layer is removed from the substrate using a standard acid etch technique. In a more preferred embodiment, an acid etch is used that is very selective to the finished semiconductor device face.

After removal of the oxide layer, or BCB layer if no oxide layer is used, the semiconductor may be processed prior to use in its products as desired by the user, processing methods including, but not being limited to, testing, dicing and integration of additional instrumentation.

What is claimed is:

1. A method of fabricating semiconductor device comprising the steps of:
   a) selecting a substrate having a front side and a back side;
   b) applying a BCB layer on the front side of the substrate;
   c) producing an oxide layer or any other suitable layer on the front of the substrate between the BCB layer and the substrate;
   d) fully curing the BCB layer, wherein the method of fully curing the BCB layer comprises the steps of:
      i) baking the BCB layer until the BCB layer is partially cured; and
      ii) baking the BCB layer until the BCB layer is fully cured;
   e) processing the semiconductor using a process selected from the group of processes composed of grinding, vapor deposition, defining patterns in the substrate, any other suitable semiconductor fabrication technique, and any combination thereof;
   f) stressing the substrate;
   g) wet etching the BCB layer, wherein wet etching of the BCB layer is performed using a chemical etch selected from the group of chemical etches composed of hydrogen fluoride, nitric acid, sulfuric acid and phosphoric acid or any combination thereof;
   h) removing the BCB layer from the substrate; and
   i) removing the oxide layer from the substrate.

2. The method of claim 1, wherein the step of stressing the substrate is performed by a process selected from the group of processes composed of mechanically grinding the substrate from the back side, etching the back side of the substrate, polishing the back side of the substrate, depositing a material film on the front or back side of the substrate, depositing an oxide layer on the front or back side of the substrate, patterning material layers on the front or back side of the substrate, depositing multiple BCB layers on the front or back side of the substrate, depositing multiple oxide layers on the front or back side of the substrate, any other suitable process or any combination thereof.

3. The method of claim 2, wherein the step of applying a BCB layer is performed by spin coating.

4. The method of claim 3, wherein the step of removing the BCB layer is performed by a dump rinse tank.

5. The method of claim 4, wherein the step of removing the oxide layer is performed by an acid etch.

6. The method of claim 5, wherein the step of producing an oxide layer is composed of producing a silicon oxide layer.

7. The method of claim 6, wherein the step of selecting a substrate is composed of selecting a silicon substrate.

* * * * *